US006242802B1

(12) United States Patent
Miles et al.

(10) Patent No.: US 6,242,802 B1
(45) Date of Patent: Jun. 5, 2001

(54) MOISTURE ENHANCED BALL GRID ARRAY PACKAGE

(75) Inventors: Barry M. Miles, Plantation; William B. Mullen, III, Boca Raton; Glenn E. Gold, Lauderhill, all of FL (US)

(73) Assignee: Motorola, Inc., Schaumburg, IL (US)

( * ) Notice: Subject to any disclaimer, the term of this patent is extended or adjusted under 35 U.S.C. 154(b) by 789 days.

(21) Appl. No.: 08/502,993

(22) Filed: Jul. 17, 1995

(51) Int. Cl.[7] .................................................. H01L 23/48
(52) U.S. Cl. ............................................. 257/738; 257/737
(58) Field of Search .................................. 257/667, 676, 257/738, 737, 778; 361/760, 807

(56) References Cited

U.S. PATENT DOCUMENTS 4,942,452   7/1990  Kitano et al. ........................ 257/676
5,296,738   3/1994  Freyman et al. ..................... 257/684
5,384,689 * 1/1995  Shen ..................................... 257/678

FOREIGN PATENT DOCUMENTS 63-224245 * 9/1988 (JP) ..................................... 257/676
1-170027    7/1989 (JP) .

* cited by examiner

Primary Examiner—Roy Potter
(74) Attorney, Agent, or Firm—Dale W. Dorinski

(57) ABSTRACT

An integrated circuit package (10) comprises a semiconductor die (14), and a substrate (16) for receiving the semiconductor die. The substrate has an aperture(s) (18) below the semiconductor die for providing moisture relief during temperature excursions. The semiconductor die is wirebonded to the substrate. An encapsulant (12) seals the top surface of the semiconductor die and serves to bond the semiconductor die to the substrate. The encapsulant also covers portions of the top side of the substrate.

5 Claims, 4 Drawing Sheets

MOISTURE ENHANCED BALL GRID ARRAY PACKAGE

TECHNICAL FIELD

This invention relates to printed circuit board chip carriers, and more particularly to overmolded and glob top chip carriers that allow for moisture relief.

BACKGROUND OF THE INVENTION

Plastic Ball Grid Array (PBGA) chip carriers, such as the Over Molded Pad Array Carrier (OMPAC™), the Over Molded Peripheral Chip Carrier (OMPCC), and the Over Molded Pin Grid Array (OMPGA) and their equivalent glob top printed circuit board chip carriers are susceptible to moisture absorption. These integrated circuit packages suffer from a well-known phenomena known as "popcorning" when subjected to heat. This problem is particularly noticeable in surface mount packages using printed circuit board (PCB) substrates, which experience thermal and mechanical stresses due to the exposure of the entire package to solder reflow temperatures. Typically, these integrated circuit packages are baked prior to solder assembly to remove moisture. Moisture usually penetrates into and through the molded plastic resin encapsulant, the PCB substrate, and especially the adhesive used to attach the die to the substrate. The die attach adhesive is usually a hygroscopic material. When the package is exposed to solder reflow temperatures after the die attach adhesive has absorbed moisture, the moisture is rapidly converted into a gas, expanding dramatically. This causes the die to delaminate from the substrate, creating the "popcorn" effect.

U.S. Pat. No. 4,866,506 by Nambu et. al. discusses a flat plastic-sealed lead frame package that has an opening on an underside of the package, allowing the die flag to be exposed to the atmosphere, thereby venting or releasing of moisture when subjected to heat. This package, also known as the Quad Flat Pack (QFP), is easily manufactured, but leaves the bottom surface of the lead frame exposed to the atmosphere. The QFP does not use a substrate or printed circuit board as in OMPAC, OMPCC, and OMPGA and their glob top equivalents; thus, a different solution is required.

U.S. Pat. No. 5,296,738 by Freyman et. al., discusses a printed circuit board chip carrier with an opening(s) in the PCB substrate, located directly beneath the semiconductor die, which provides the means for moisture relief when the package is subjected to extreme temperature excursions (i.e., board reflow profiles). In this package, the opening is initially covered on the back side of the printed circuit board substrate with solder resist. The covered opening prevents the flow of die attach material from the top side surface through the opening and onto the backside solder pads; however, the opening(s) are partially or completely filled with die attach material. After final assembly of the package, the solder resist must be pierced or punctured to create the final opening for moisture relief.

DESCRIPTION OF THE PREFERRED EMBODIMENT

An integrated circuit package comprises a semiconductor die having a top surface and a bottom surface, and a substrate for receiving the semiconductor die. The substrate should have an aperture(s) below the semiconductor die which must remain free of any obstruction. An over-molded or glob top material encapsulates the semiconductor die and portions of the substrate. The die is held in place on the substrate strictly by the compressive force of the encapsulant. No die attach adhesive is used to mount the semiconductor die to the substrate, thus the package is less susceptible to the effects of moisture absorption, as the hygroscopic die attach material is eliminated.

Figure 1:
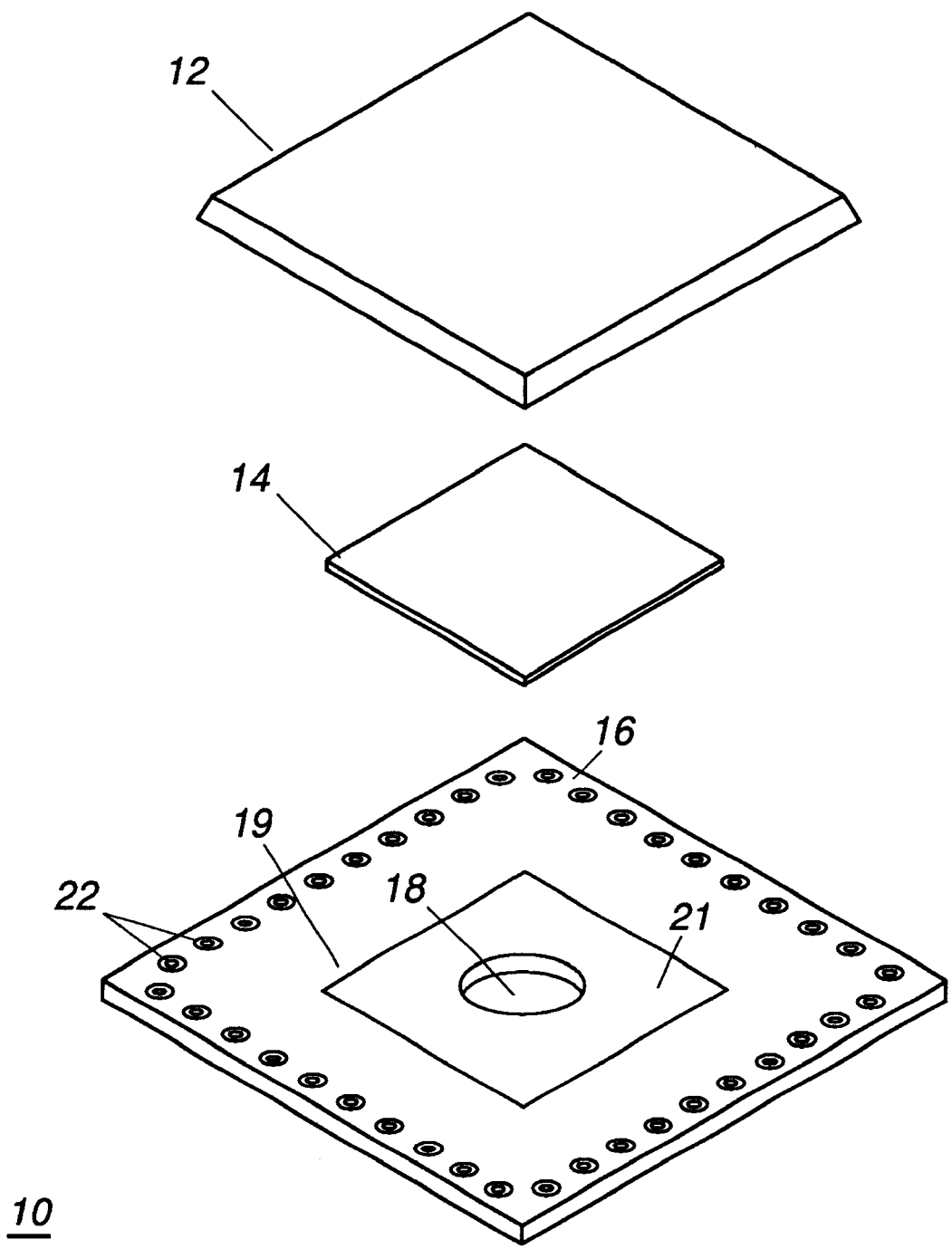
FIG. 1 is an exploded perspective view of an overmolded chip carrier in accordance with the present invention.

Referring to FIG. 1, there is shown a leadless chip carrier 10 in accordance with the present invention. Although shown as an overmolded leadless chip carrier, the chip carrier may take the form of an overmolded pad array carrier, an overmolded pin grid array, an overmolded peripheral chip carrier, or alternatively, a glob top pad array carrier, a glob top pin grid array, or a glob top peripheral array chip carrier. Examples of overmolded and glob top carriers, also known as BGA or PBGA carriers, are found in the following U.S. Pat. Nos. incorporated herein by reference, 5,241,133, 4,688,152, 5,239,198, and 5,296,738. Essentially, the present invention is applicable to any printed circuit substrate chip carrier having integrated circuits and an encapsulant such as an over-mold or glob top. Typically, a PCB 16 for receiving a semiconductor die 14 has printed circuitry 22 on the top side of the PCB. A die mounting area 19 is also on the top side, situated generally in the center of the PCB. A hole(s) or aperture(s) 18 is situated in the die mounting area 19 and constructed so as to reside below the semiconductor die 14. The hole 18 is preferably small enough so as to not alter the design of the solder connections on the bottom of the package, and extends completely through the PCB to form a via. The hole 18 serves as a vent opening to allow any moisture that has accumulated or absorbed in the package to escape during the high temperatures encountered during solder reflow. In the preferred embodiment, a metal die flag 21 is located in the die mounting area 19, so that the semiconductor die falls upon the die flag. However, one can envision applications where a metal die flag is not needed in the package, and then the die would be mounted directly on the dielectric surface of the printed circuit substrate. One version of the metal die flag pattern is a solid die flag. In this embodiment, the entire region under the semiconductor die is a solid metal flag, except, of course, where the openings for the vent holes reside. In all cases, the vent hole(s) must remain open and uncovered to allow for free movement of the entrapped moisture during the temperature excursion of the soldering operations.

Figure 2:
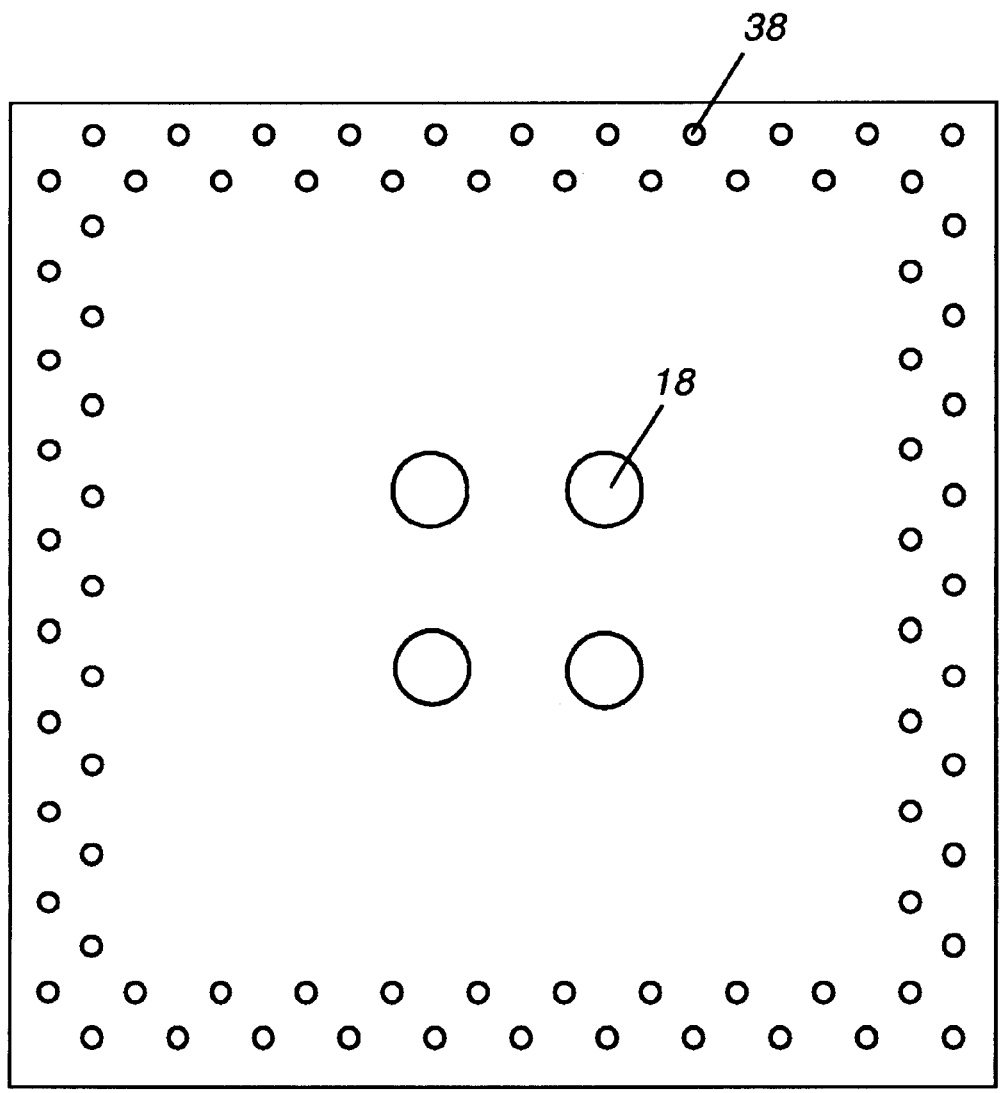
FIG. 2 is plan view of the bottom side of a perimeter chip carrier in accordance with the invention

The semiconductor die 14 or chip is placed directly onto the PCB 16 in the die mounting area. Contrary to the processes of the prior art, a die attach adhesive is not used to secure the die in place. The chip 14 is temporarily held in place by a vacuum that is drawn on the bottom side of the chip, through the vent holes 18 in the PCB 16. The die 14 is then wire bonded using conventional wire bonding techniques, as the die is firmly held in place by the vacuum. When wire bonding is complete, the vacuum is removed, and the die remains in place by virtue of the wire bonds that have been made between the die and the PCB. After wire bonding, a plastic resin such as a glob top or transfer molded encapsulant 12 is applied over the die and portions of the substrate 16 forming the PBGA chip carrier 10 shown in FIG. 1. In the preferred embodiment, the perimeter portion of the top surface of the substrate is not covered by the encapsulating resin. Also, in this embodiment, the bottom side of the PCB substrate is not covered with encapsulant. In some cases, it may be necessary to again draw a vacuum through the vent holes to hold the die in place during the encapsulation process, but care must be exercised in order to prevent molding compound from running under the die and entering the vent holes. Typically, when the encapsulant, be it glob top or transfer molded, cures and cools to room temperature, the plastic resin encapsulant shrinks somewhat, causing the die 14 to be compressively forced down onto the PCB substrate, thus insuring good and intimate contact between the die and the substrate. The reader should note that the novel package of the instant invention is absent any die attach material, in contrast to the conventional art. The incorporation of a larger void area and/or opening(s) is especially advantageous for the new, higher I/O (>200) perimeter PBGA packages. As shown in FIG. 2, a perimeter carrier typically has surface mount solder pads 38 on the back side of the printed circuit board substrate located in array format, but only in 3 to 4 rows around the perimeter of the package, leaving the center of the package free of solder interconnection sites. Therefore, a single, large opening or a number of smaller opening(s) 18 can be placed in this area to provide for enhanced moisture relief.

Figure 3:
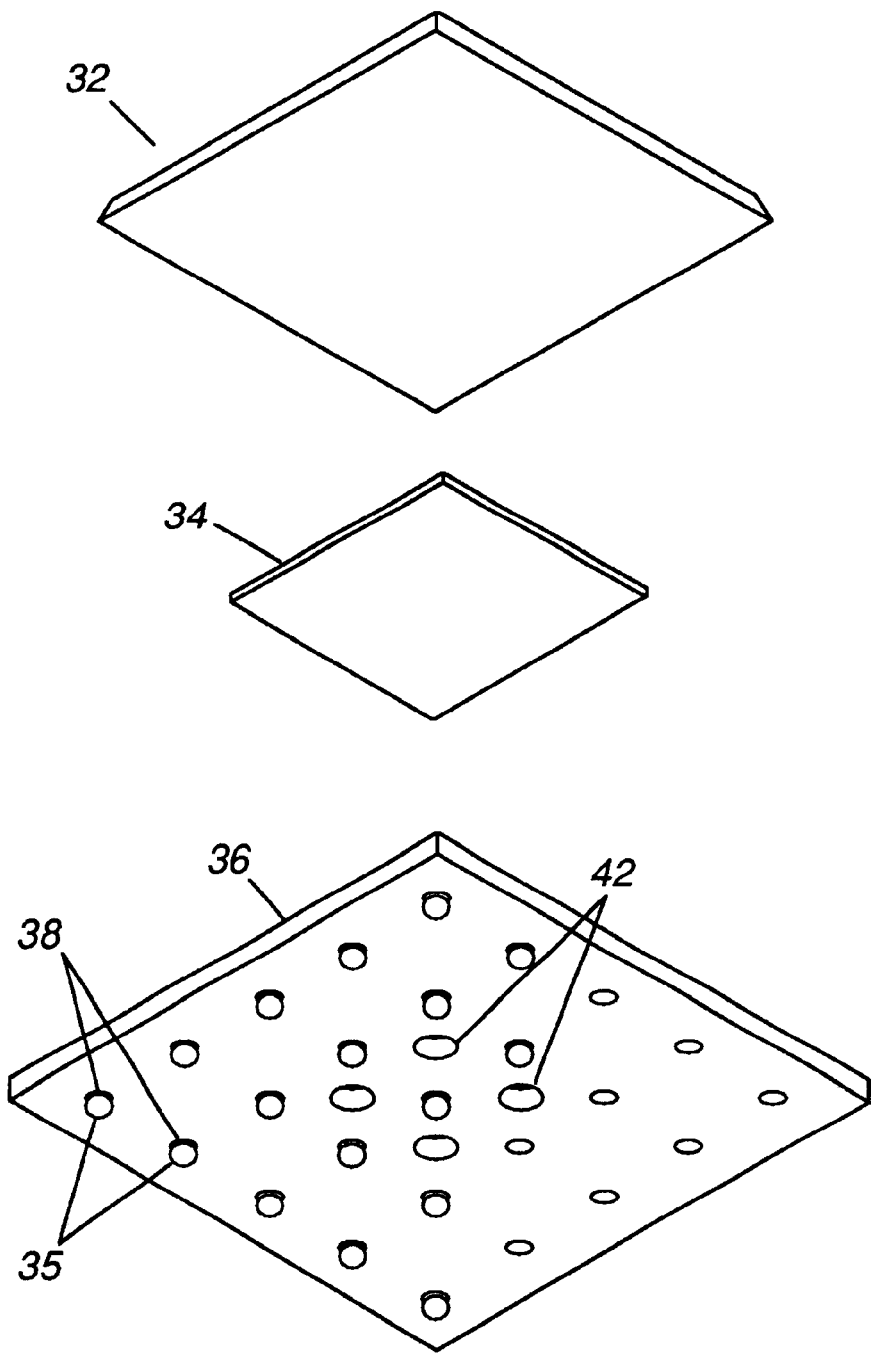
FIG. 3 is an exploded view showing the bottom surfaces of a overmolded pad array carrier in accordance with the present invention.

Referring now to FIG. 3, there is shown another overmolded chip carrier 30 in accordance with the present invention. This version of a PBGA carrier 30 includes an array of solder pads 38 disposed on the bottom portion of a substrate 36 to form a pad grid array carrier. The PBGA carrier may be furnished with bare solder pads 38 or the solder pads may optionally have solder balls or bumps 35. In FIG. 3, only some of the solder pads 38 are shown as having solder bumps 35 for illustrative purposes. In practice, either all of the pads will contain bumps, or none of them will. A hole(s) or aperture(s) 42 is arranged and constructed so as to reside below the semiconductor die 34. The hole(s) 42 is preferably small enough not to alter the design of a solder bumped pad array on the bottom of a package as shown. An encapsulating compound 32, such as a glob top or transfer molded resin, is formed over the die and portions of the substrate 36.

Figure 4:
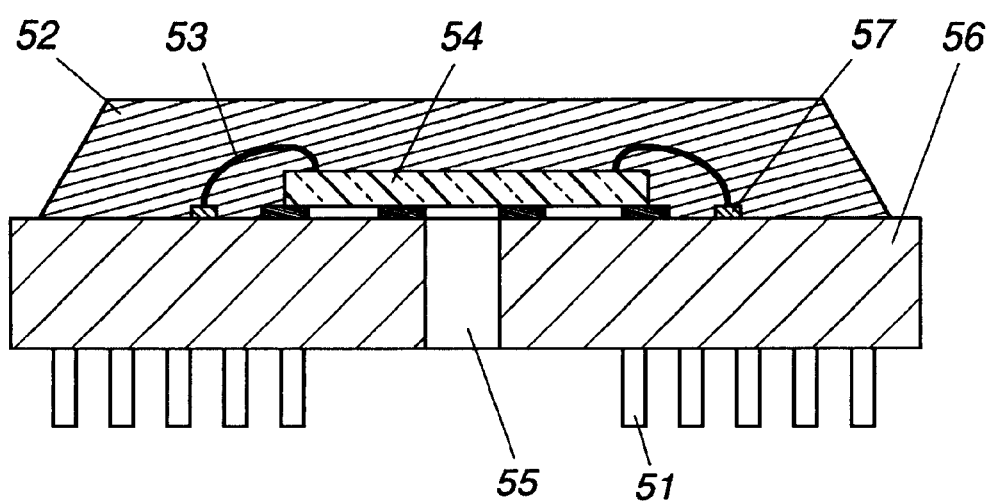
FIG. 4 is a cut view of overmolded pin grid array chip carrier in accordance with the present invention.

Referring now to FIG. 4, there is shown a cut view of a leaded chip carrier, known as a pin grid array version of a PBGA, (OMPGA) 50. The OMPGA is formed essentially as described above in FIG. 3, with the addition of pins 51 protruding from the bottom of the package. The OMPGA 50 comprises a substrate 56 having at least one aperture 55 residing below a semiconductor die 54. The back plane of the die 54 is attached to the substrate 56 via the compressive forces of the encapsulant 52 that is formed above the substrate and around the die. Some of the conductive runners 57 on the substrate 56 are coupled to the die 54 via a wirebond 53.

In summary, the present invention provides for a novel means of moisture relief for plastic encapsulated chip carriers made from printed circuit substrates. The die is mounted directly onto the substrate, and is held there by the compressive force of the encapsulant. Since good mechanical contact is maintained between the die and the substrate, a reliable ground connection between the ground plane on the back of the die and the metal die flag is formed. By providing a vent hole under the semiconductor die that is free of any obstructions, such as die attach adhesive, any moisture that has accumulated within the package can be quickly and easily vented to the atmosphere. In contrast to the prior art, the package of the instant invention does not have to be modified during assembly, since there is no solder resist or adhesive covering the hole that must first be pierced. Further, the elimination of the hygroscopic die attach material removes the one component that is most responsible for moisture absorption, thereby providing a package that is more stable in humid environments and that is more amenable to automated assembly.

We claim as our invention:

1. A leadless chip carrier package that does not have a die attach adhesive, comprising:

a printed circuit substrate having a die mounting area on a first side and having one or more vent openings located in the die mounting area, the vent openings extending through the substrate from the first side to a second opposing side, and the second side having a plurality of surface mount solder pads;

a semiconductor die disposed in the die mounting area and covering the vent openings, the semiconductor die electrically connected to the printed circuit substrate by at least one wirebond, and the semiconductor die lying directly on the substrate with no die attach adhesive between the die and the substrate; and a plastic resin encapsulating the semiconductor die and providing a compressive force to secure the semiconductor die in direct and intimate contact with the printed circuit substrate die mounting area, the plastic resin further encapsulating the at least one wirebond and covering portions of the printed circuit substrate first side.

2. The leadless chip carrier package of claim 1, wherein a perimeter portion of the substrate first side is not covered with the plastic resin.

3. The leadless chip carrier package of claim 1, wherein the plastic resin comprises a glob top encapsulant or a transfer molded encapsulant.

4. The leadless chip carrier package of claim 3, wherein the plurality of surface mount solder pads comprises a pad grid array.

5. The leadless chip carrier package of claim 3, wherein the plurality of surface mount solder pads comprises a peripheral array.

* * * * *